United States Patent [19]
Uchibori et al.

[11] Patent Number: 5,996,793
[45] Date of Patent: Dec. 7, 1999

[54] METHOD OF STORING AND KIT CONTAINING DRY IMAGE-FORMING MATERIAL

[75] Inventors: Takahiro Uchibori; Tetsuya Higuchi; Masao Suzuki; Yoshitaka Sugimoto, all of Kanagawa, Japan

[73] Assignee: Cycolor Systems Co., Ltd., Tokyo, Japan

[21] Appl. No.: 09/055,798

[22] Filed: Apr. 6, 1998

[30] Foreign Application Priority Data

| Apr. 15, 1997 | [JP] | Japan | 9-113446 |
| May 26, 1997 | [JP] | Japan | 9-151503 |
| Sep. 5, 1997 | [JP] | Japan | 9-257521 |

[51] Int. Cl.$^6$ .............................. G03C 3/00; G03C 1/72
[52] U.S. Cl. ........................ 206/455; 430/138; 430/211
[58] Field of Search ................... 206/455; 430/138, 430/211; 264/4.1; 428/402.2

[56] References Cited

U.S. PATENT DOCUMENTS

| 2,730,456 | 1/1956 | Green et al. . | |
| 2,800,457 | 7/1957 | Green et al. . | |
| 3,755,190 | 8/1973 | Hart et al. | 252/316 |
| 3,759,809 | 9/1973 | Carlick et al. | 204/159 |
| 3,783,151 | 1/1974 | Carlick et al. | 260/471 |
| 3,796,669 | 3/1974 | Kiritani et al. | 252/316 |
| 3,914,511 | 10/1975 | Vassiliades | 428/411 |
| 4,001,140 | 1/1977 | Foris et al. | 252/316 |
| 4,025,455 | 5/1977 | Shackle | 252/316 |
| 4,399,209 | 8/1983 | Sanders et al. | 430/138 |
| 4,440,846 | 4/1984 | Sanders et al. | 430/138 |
| 4,772,541 | 9/1988 | Gottschalk et al. | 430/339 |
| 4,935,329 | 6/1990 | Hipps, Sr. et al. | 430/138 |
| 4,965,165 | 10/1990 | Saccocio et al. | 430/138 |
| 5,049,902 | 9/1991 | Duke | 346/110 R |
| 5,217,841 | 6/1993 | Ishikawa | 430/256 |
| 5,884,114 | 3/1999 | Iwasaki | 396/583 |

FOREIGN PATENT DOCUMENTS

| 0 295 943 A2 | 12/1988 | European Pat. Off. . |
| 2 516 269 | 5/1983 | France . |
| 57-173194 | 10/1982 | Japan . |
| 58-24492 | 2/1983 | Japan . |
| 62-18537 | 1/1987 | Japan . |
| 62-150242 | 7/1987 | Japan . |
| 64-60606 | 3/1989 | Japan . |
| 64-91130 | 4/1989 | Japan . |
| 1-168484 | 7/1989 | Japan . |
| 2-868 | 1/1990 | Japan . |
| 2-95884 | 4/1990 | Japan . |
| 2-291561 | 12/1990 | Japan . |
| 2-298340 | 12/1990 | Japan . |
| 3-20260 | 1/1991 | Japan . |
| 3-20261 | 1/1991 | Japan . |
| 3-116043 | 5/1991 | Japan . |
| 5-31856 | 2/1993 | Japan . |
| 5-224426 | 9/1993 | Japan . |

*Primary Examiner*—Nathan M. Nutter
*Attorney, Agent, or Firm*—Flynn, Thiel, Boutell & Tanis, P.C.

[57] ABSTRACT

A method of storing and a kit containing a full color dry image-forming material which does not form a muddy color, even after being stored over a long period of time, is provided by;

1) A method of storing and a kit containing a dry image-forming material comprising a support and a layer provided thereon containing microcapsules containing at least a photo-curable compound, a photo initiator and a color precursor in the internal phase. The material contains a color-developer in the layer containing the microcapsule or a layer adjacent thereto and the dry image-forming material is packed together with a humidity-controlling material; or, 2) The method of storing and kit as above, wherein the dry image-forming material and a humidity-controlling material are stored with a low moisture-permeable film.

19 Claims, No Drawings

METHOD OF STORING AND KIT CONTAINING DRY IMAGE-FORMING MATERIAL

BACKGROUND OF THE INVENTION

1. Field of the Invention

The present invention relates to a method of storing a dry image-forming material using light-sensitive microcapsules, specifically to a method of storing a dry image-forming material which has an excellent storage stability during production and use.

2. Description of Prior Art

Imaging processes based on photosensitive microencapsulated materials are well known. The Meed Corporation discloses a method for forming an image through exposure-controlled release of an image-forming agent from a microcapsule containing a photohardenable composition in U.S. Pat. Nos. 4,399,209, 4,440,846 and 4,772,541.

In the method, a colorless image-forming agent, called a leuco dye, which is released under exposure-control from a microcapsule, is reacted with a color-developer present outside the microcapsule to form a color image.

U.S. Pat. No. 4,399,209 describes a transfer imaging system. That is, an image-forming agent is image-wise transferred to a developer sheet containing a chromogenic material and reacted with a developer to form an image. U.S. Pat. No. 4,440,846 discloses a 'self-contained' system wherein an imaging system and a developer are present on the same support. That is, an image-forming agent is encapsulated in pressure-rupturable capsules, and upon exposure and capsule rupture the image-forming agent contacts and reacts with the developer to form an image on the support. These methods have excellent characteristics as a dry color imaging method.

The above imaging material cures the internal phase of a microcapsule or increases the viscosity thereof to control the release of a color precursor in pressure-rupturing to form a positive-positive image pattern upon exposure to light. However, it has the defect that the degree of hardening of the internal phase of a microcapsule or increasing the viscosity thereof is varied by a change in environment, particularly a variation in humidity, and as a result thereof, photographic characteristics such as light-sensitivity, maximum density and fogging density are changed.

This defect presents a serious problem in full color imaging. That is, in forming a full color image, color precursors which develop into yellow, magenta and cyan colors and photo-initiators corresponding to blue, green and red lights are encapsulated in an internal phase of the microcapsules, and the three sets of the microcapsules are mixed to prepare a full color imaging material containing a developer. However, the photographic characteristics of the respective microcapsules vary with a change in humidity to different degrees, which results in causing a problem of producing muddy colors.

That is, for example, when a yellow color is developed, cyan and magenta capsules are cured by red and green lights, and only a yellow color former reacts with a color-developer to form an image. However, the cyan or magenta capsule may insufficiently cure due to a change in humidity in certain cases, and as a result thereof, a muddy color in which cyan or magenta is blended with yellow is produced in some cases.

Such a muddy color phenomenon due to a change in humidity has been a large problem in designing a processor for forming an image when an imaging material is used as a system material to be integrated with hardware, particularly in the case when an imaging material is used as an output material for an image on a personal computer.

DISCLOSURE OF THE INVENTION

SUMMARY OF THE INVENTION

A first object of the present invention is to provide a method of storing a dry image-forming material which does not cause a muddy color, even after being stored over a long period of time.

A second object of the present invention is to provide a method of storing a dry imaging material which causes less changes in the materials photographic characteristics, even after being stored over an extended period of time.

Such objects of the present invention have been able to be achieved by a method of storing a dry image-forming material comprising a support and a layer provided thereon containing microcapsules containing at least a photohardenable compound, a photo initiator and a color precursor in the internal phase, and further containing, outside the microcapsules, a color-developer in either a layer containing the capsules or a layer adjacent thereto, which comprises storing the dry image-forming material together with a humidity-controlling material. The color-developer may be present outside the microcapsules.

Further, the objects of the present invention are achieved by a method of storing a dry image-forming material, by storing both the dry image-forming material and the humidity-controlling material with a low moisture-permeable film.

DETAILED EXPLANATION OF THE INVENTION

The present invention will be described in detail.

The salt solutions used for the humidity-controlling material in the present invention include, for example, aqueous solutions described in Kagaku Binran, Kisohen II (Chemical Handbook, Basic Course II) edited by Nippon Kagakukai, published by Maruzen, pp. 731 to 748 (1975), particularly, solutions giving the fixed humidity shown in Table 7.64 at p. 748. To be specific, the following salt solutions are included; $BaCl_2.2H_2O$, $CH_3COOK$, $CH_3COONa.3H_2O$, $CaCl_2.6H_2O$, $Ca(NO_3)_2.4H_2O$, $CaSO_4.2H_2O$, $CrO_3$, $H_2C_2O_4.2H_2O$, $H_3PO_4.1/2H_2O$, KBr, KF, $KHSO_4$, KI, $KNO_3$, $K_2CO_3.2H_2O$, $K_2CrO_4$, $K_2HPO_4$, KNCS, $LiCl.H_2O$, $Mg(CH 3COO)_2.4H_2O$, $Mg(NO_3)_2.6H_2O$, $NH_4Cl$, $NH_4Cl+KNO_3$, $NH_4H_2PO_4$, $(NH_4)_2SO_4$, NaBr, $NaBr.2H_2O$, $NaBrO_3$, $NaCl+KNO_3+NaNO_3$, $NaClO_3$, NaF, $NaHSO_4.H_2O$, NaI, $NaNO_2$, $Na_2CO_3.10H_2O$, $Na_2Cr_2O_7.2H_2O$, $NaHPO_4.12H_2O$, $Na_2SO_3.7H_2O$, $Na_2SO_4.10H_2O$, $Na_2S_2O_3.5H_2O$, $Pb(NO_3)_2$, TiCl, $TiNO_3$, $Ti_2SO_4$, $ZnCL_2.3/2H_2O$, $Zn(NO_3)_2.6H_2O$ and $ZnSO_4.7H_2O$. Any salts can be used as long as they are water-soluble salts and the salts shall not be restricted thereto.

These salt solutions, having been controlled to be saturated or an optional concentration, may be used. Further, these salt solutions can be controlled to optional humidities by suitably selecting the kinds and concentrations of the salts. When it is desired to adjust the relative humidity to 100%, it can be achieved by adding water. A fungicide and a preservative may be used together in addition to the salt solution or water.

The humidity-controlling material used in the present invention can be used repeatedly until the water content is used up, and can be used again by letting it stand under a suitable humid atmosphere, even after the water content is used up.

The water-absorbing substances used in the present invention are preferably used by impregnating a high water-absorbing resin usually used for a paper diaper with a salt solution and water. Resin grains having a water absorbing ability up to 50 to 1000 times their own weight can suitably be used as well for the high water-absorbing resin. To be specific, as described in JP-A-57-173194 and JP-A-58-24492, there can be given metal salts of a polyacrylic acid such as poly(sodium acrylate), poly(lithium acrylate) and poly(potassium acrylate), vinyl alcohol-acrylamide copolymers, sodium acrylate-acrylamide copolymers, cellulose-based polymers such as carboxymethyl compounds and graft polymers, starch-based polymers such as hydrolyzed products of an acrylonitrile-grafted compound and acrylic acid-grafted products, isobutylene-maleic anhydride copolymer, a modified polyethylene oxide, polydiacryldimethylammonium salts, and polyacrylic acid quaternary ammonium salts. At least one kind thereof can be used. The particularly preferred high water-absorbing resins are vinyl alcohol-acrylamide copolymers and polyethylene oxide-modified products.

Cotton, pulp, sponge, cloth or non-woven fabric can be used as a water-absorbing substance in addition to the high water-absorbing resins.

The film and the non-woven fabric used for the humidity-controlling materials in the present invention are water-impermeable and vapor-permeable.

Films obtained by making numerous fine pores of 0.01 to 10 μm through films of, for example, polyethylene, polypropylene, polyurethane and a fluororesin are used as the film. Among them, a polyethylene or polypropylene type film is preferably used in the present invention because they are inexpensive and have a heat sealing property. Espoir (trade name, manufactured by Mitsui Toatsu Kagaku KK) and Hipore (trade name, manufactured by Asahi Kasei Kogyo KK) are available in the market as these films.

Non-woven fabrics obtained by weaving random fibers of resins such as polyethylene, polypropylene and nylon, particularly polyethylene or polypropylene based non-woven fabrics having a heat sealing property, are preferred as the water-impermeable and vapor-permeable non-woven fabric. Various resins are available in the market as these non-woven fabrics and, for example, Taibeck (trade name, manufactured by Du Pont) using high density polyethylene as a raw material is available. These films and non-woven fabrics have a thickness of 5 to 500 μm, preferably 10 to 200 μm.

The humidity-controlling material used in the present invention preferably contain the water-absorbing substance containing a salt solution or water in a vessel or a bag comprising a water-impermeable and vapor-permeable film or non-woven fabric. The whole wall of the vessel or bag does not have to be composed of the film or non-woven fabric described above, and at least a part of the wall may be composed of the film or non-woven fabric described above. The other part of the wall may be reinforced by a reinforcing member. Natural or synthetic polymers usually used for vessels, cloth and non-woven fabrics are used as the reinforcing member.

The humidity-controlling material used in the present invention can be produced according to production methods for sanitary napkins, paper diapers or water-absorbing sheets described in JP-A-5-31856. For example, a water-absorbing resin such as poly(sodium acrylate) is dispersed on a film coated with an adhesive binder such as a heat-meltable polymer and a latex, and then covered with a cloth, a film or paper to prepare a sheet having a high water-absorbing resin-containing layer as a core, followed by impregnating it with a salt solution, water, or the like, whereby the humidity-controlling material can be prepared. In this case, a fungicide and a preservative may be used together therewith.

The cloth covering the high water-absorbing resin includes cloths using various fibers such as fibers comprising pulp, cellulose and synthetic resins. The film includes water-impermeable and vapor-permeable films. The paper includes Japanese paper, normal paper and synthetic paper such as rayon paper. Further, a humidity-controlling material which is covered with a cloth, a film or paper is further covered particularly preferably with a non-woven fabric in order to prevent moisture released from the humidity-controlling material from contacting directly with the dry image-forming material.

The low moisture-permeable film used in the present invention includes films obtained by laminating the resins described above on resin films of fluorinated resins such as polytetrafluoroethylene and polytrifluoroethylene, chlorinated rubber, polyvinylidene chloride, a copolymer of vinylidene chloride and acrylonitrile, polyethylene and polypropylene, and on plastic films of polyesters, or films obtained by depositing a metal such as aluminum and a metal oxide such as silicon oxide. The films available in the market include Saran UB manufactured by Asahi Kasei Kogyo KK, Kureharon manufactured by Kureha Kagaku Kogyo KK, VM-P manufactured by Toyo Boseki KK and Metaline Film manufactured by Tosero KK.

A package for the dry image-forming material and the humidity-controlling materials includes a cassette (for example, a plastic cassette case for computer image formation) and a black-colored polyethylene bag (for example, a light-shielding bag used for packing a silver halide photographic light-sensitive material).

The humidity-controlling material may be allowed to exist at both sides or one side of the dry imaging material, and in the case of a cassette, the humidity-controlling material may be adhered to the inside of the case.

When the dry image-forming material and the humidity-controlling material are stored with the low moisture-permeable film, they may be done directly with the low moisture-permeable film, or a separator such as synthetic paper and a plastic film may be used. Further, the dry image-forming material and the humidity-controlling material may be put in the plastic cassette case described above, and then the cassette case may be stored with the low moisture-permeable film.

The photosensitive microcapsules used in the present invention can be produced according to the methods disclosed in U.S. Pat. Nos. 4,399,209 and 4,440,846 described previously. That is, the light-sensitive microcapsules contain a photo initiator and a photohardenable agent in an internal phase. They are typically a photo-polymerizable material and a photo-cross-linkable material, and are thickened or cured by exposure. Further, a color precursor is contained therein in addition to the light-sensitive materials described above.

The photo-curable compound used in the present invention is preferably a material capable of being cured by radical addition polymerization or ionic polymerization but will not specifically be restricted thereto.

The typical photo-curable compound is an ethylenically unsaturated organic compound. These compounds are preferably liquid and contain at least one terminal ethylene group per molecule. Further preferred examples of the photo-curable material are ethylenically unsaturated organic compounds having two or more ethylene groups per molecule. The typical examples of these compounds are ethylenically unsaturated acid esters of polyhydric alcohols such as trimethylolpropane triacrylate and dipentaerythritolhydroxy pentaacrylate.

Further, other examples thereof include acrylate prepolymers obtained by partial reaction of pentaerythritol with acrylic acid or an acrylic acid ester, and isocyanate-modified acrylic acid esters, methacrylic acid esters and itaconic acid esters of polyhydric alcohols disclosed in U.S. Pat. Nos. 3,783,151 and 3,759,809.

The photo-initiator produces free radicals capable of starting free radical polymerization of polymerizable or cross-linkable compounds by absorbing radiation.

Ionic dye-counter ionic compounds shown in JP-A-62-150242, JP-A-64-60606, JP-A-3-20260 and JP-A-3-116043 are preferably used as the photo-initiator according to the present invention.

The preferred ionic dye-counter ionic compounds are a cationic dye borate which is a compound represented by the following formula:

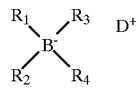

wherein D represents a cationic dye; $R_1$, $R_2$, $R_3$ and $R_4$ each represent an alkyl group, an aryl group, an aralkyl group, an alkaryl group, an alkenyl group, an alkynyl group, a cycloalkyl group or an allyl group; and $R_1$, $R_2$, $R_3$ and $R_4$ may be the same or different.

The useful dye forms a photo-reductive complex with a borate anion and include cationic methine, polymethine, triarylmethane, indoline, thiazine, oxazine and acridine dyes. More preferably, the dye is a cationic cyanine, carbocyanine, hemicyanine, Rhodamine or azomethine dye.

The useful cation dye is a cyanine dye represented by the following formula:

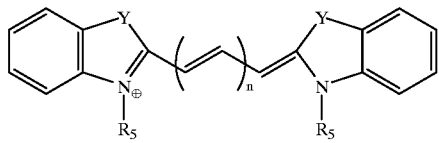

wherein n is 0, 1, 2 or 3; $R_5$ represents an alkyl group; and Y represents CH=CH, N—$CH_3$, $C(CH_3)_2$, O, S or Se.

In the borate anion, one to three or less of $R_1$, $R_2$, $R_3$ and $R_4$ are preferably alkyl groups. The alkyl group has up to 20 carbon atoms, more preferably 1 to 7 carbon atoms. $R_1$, $R_2$, $R_3$ and $R_4$ are a combination of an alkyl group, an aryl group or an aralkyl group and more preferably a combination of three aryl groups and one alkyl group (for example, triphenylbutylborate).

Further, other examples thereof include, as disclosed in JP-A-5-224426, diaryl ketone derivatives, polycyclic quinones, benzoin alkyl ethers, alkoxyphenyl ketones, o-acylated oxyimino ketones, phenanthrenequinone, benzophenone, substituted benzophenones, xanthone, thioxanthone, halogenated compounds, for example, chlorosulfonyl and chloromethyl polynuclear aromatic compounds, chlorosulfonyl and chloromethyl heterocyclic compounds, chlorosulfonyl and chloromethyl benzophenone, fluorenone, and halo alkanes.

A colorless electron-donating compound can be used as a dye precursor in the present invention. Typical examples of this compound include substantially colorless compounds having a lactone, lactam, sultone, spiropyran, ester or amide structure in a partial skeleton thereof. They include, for example, triarylmethane compounds, bisphenylmethane compounds, xanthene compounds, fluoran compounds, thiazine compounds and spiropyran compounds. Next, the specific examples of the dye precursors developing colors of yellow, magenta and cyan shall be shown:

Yellow color precursors:

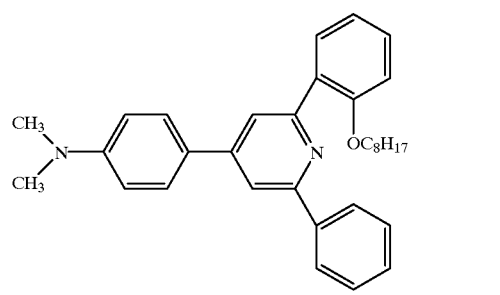

Y-1

Y-2

Magenta color precursors:

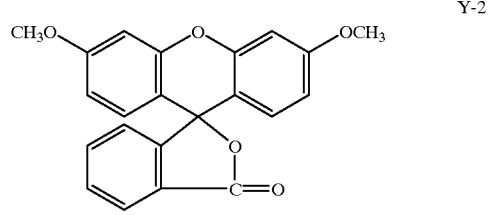

M-1

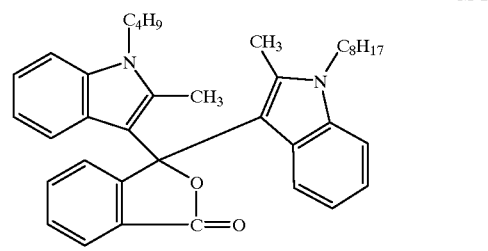

M-2

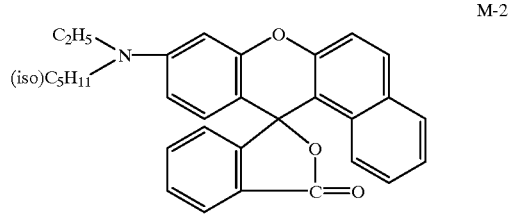

M-3

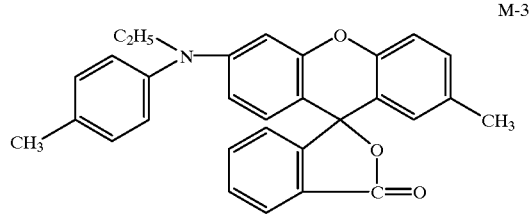

Cyan color precursors:

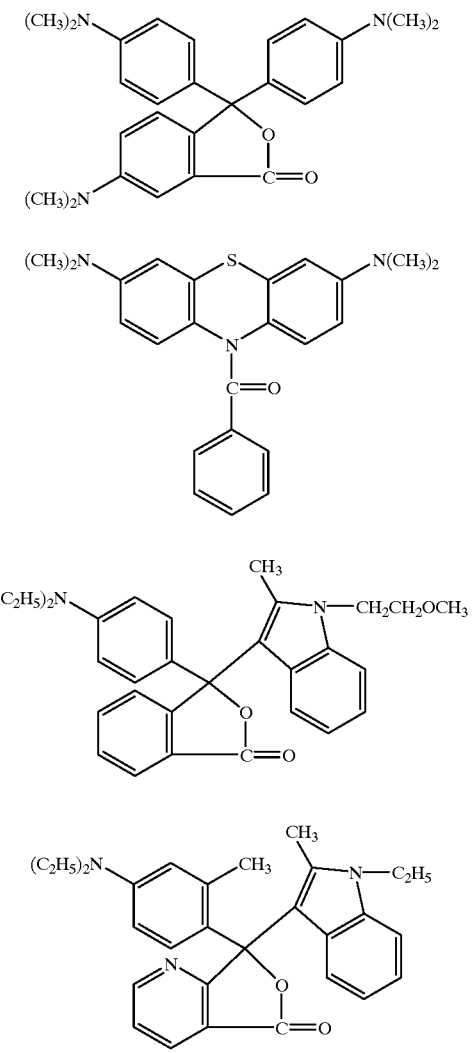

The light-sensitive microcapsules used in the present invention can use a sensitizer to improve photosensitivity, for example, N,N-dialkylaniline and the like defined as an auto-antioxidant described in JP-A-62-18537 and JP-A-64-91130, disulfide compounds such as mercaptobenzothiazole disulfide and the like described in JP-A-2-291561, and thiol compounds described in JP-A-2-868.

A discontinuous walled microcapsule of the present invention, used for encapsulating the internal phase, can be produced according to known encapsulation techniques including coacervation, interfacial polymerization and polymerization of one or more monomers in an oil.

Typical examples of suitable capsule wall-formers include gelatin materials (U.S. Pat. Nos. 2,730,456 and 2,800,457) including gum arabic, polyvinyl alcohol and carboxymethyl cellulose; resorcinol-formaldehyde capsule wall-formers (U.S. Pat. No. 3,755,190), isocyanate wall-formers (U.S. Pat. No. 3,914,511), isocyanate-polyol wall-formers (U.S. Pat. No. 3,796,669), urea-formaldehyde wall-formers, particularly urea-resorcinol-formaldehyde in which a lipophilic property is strengthened by adding resorcinol (U.S. Pat. No. 4,001,140) and melamine-formaldehyde and hydroxypropyl cellulose (U.S. Pat. No. 4,025,455).

The microcapsules used in the present invention have an average grain diameter falling preferably in a range of 1 to 25 micron. The capsules have preferably a small and uniform grain diameter in terms of the photographic characteristics such as resolving power. In consideration of their breakability by applying pressure and troubles such as missing in the pores or fibers of the support, the sizes are controlled preferably to 3 to 15 micron, particularly preferably 3 to 10 micron.

The above microcapsules are mixed with a dispersion of the color-developer and applied on a paper or film support, whereby a self-contained type sheet can be prepared. In this case, a suitable binder such as polyvinyl alcohol and styrene-butadiene latex may be used. In such a case, the microcapsules can suitably be mixed with the dispersion of the developer in a proportion of 2/8 to 8/2 in terms of the weight ratio of the solid matters, and they are mixed particularly preferably in a proportion of 4/6 to 6/4. The above microcapsules are applied on a paper or film support using a suitable binder such as polyvinyl alcohol and styrene-butadiene emulsion, and then the dispersion of the developer is coated thereon, whereby a self-contained type sheet can be prepared. In this case, after applying the developer dispersion on the support, the microcapsule dispersion is coated thereon, whereby a self-contained type sheet can be prepared as well.

Developing substances usually used for carbonless paper are suitably used as a color-developer, and included are clay substances such as an acid clay, activated clay, atabargite and zeolite; and organic substances such as a phenol resin, a phenol-formaldehyde resin, and aromatic carboxylic acids and metal salts thereof, for example a metal salt of salicylic acid.

The support used in the present invention includes synthetic resin films of polyethylene, polypropylene, polyethylene terephthalate, polycarbonate and cellulose acetate, synthetic papers, so-called resin-coated papers coated with resins such as polyethylene, art paper, and baryta paper.

According to the present invention, there could be provided a method of storing a full color dry image-forming material which does not cause a muddy color, even after being stored over a long period of time.

The present invention will specifically be explained below with reference to the examples, but not restricted only to them.

EXAMPLES

The present invention will be explained below based on the examples.

Example 1

I. Preparation of light-sensitive microcapsule
I-1 Preparation of magenta microcapsule A light-sensitive microcapsule was prepared with reference to the examples described in JP-A-2-298340.
A. Preparation of internal phase (1) 105 g of trimethylolpropane triacrylate (TMPTA) and 45 g of dipentaerythritolhydroxy pentaacrylate (DPHPA) were added to a beaker and heated at about 105° C. for 30 minutes.

(2) 20 g of a dye precursor (M-1) was added and dissolved while stirring. Further, stirring was continued at 105° C. for 30 minutes while heating, and then the solution was gradually cooled down to 70° C.

(3) 0.5 g of a photo initiator (1,1'-di-n-heptyl-3,3,3',3'-tetramethylindocarbocyanine triphenyl-n-butylborate) was added while stirring, and then stirring was further continued at 70° C. for 30 minutes.

(4) 1.0 g of DIDMA (2,6-diisopropyl-N,N-dimethylaniline) was added while stirring, and stirring was continued for 5 minutes.

(5) 0.5 g of 2,2'-Dibenzothiazolyl disulfide was added, and stirring was continued for 20 minutes.

(6) 10 9 of Duranate 24A-90PX (polyisocyanate manufactured by Asahi Kasei) was added and maintained at 70° C.

B. Preparation of external phase (1) 430 g of water was added to a beaker and stirred by means of an overhead mixer at 500 rpm.

(2) 8.0 9 of Varsa TL-502 (sulfonated polystyrene manufactured by National Starch) was slowly added and further stirred at 500 rpm for 15 minutes.

(3) 12.65 g of pectin and 0.24 g of sodium hydrogencarbonate were mixed and added while stirring at a stirring speed controlled to 1500 rpm, and then stirring was further continued at 1500 rpm for 2 hours.

(4) NaOH was used to control the pH to 6.0, and stirring was further continued at 3000 rpm for 10 minutes.

C. Emulsification of internal phase in external phase (1) The internal phase was gradually added to the external phase in about 30 seconds.

(2) Stirring was carried out for emulsification at 3000 rpm for 15 minutes to form an emulsion.

D. Formation of melamine-formaldehyde wall (1) 250 g of water was added to a beaker, and 22.2 g of melamine was gradually added while stirring.

(2) 36.5 9 of 37% formaldehyde was gradually added.

(3) The solution was heated up to 60° C. in about 30 minutes, and curing was carried out at 60° C. for 60 minutes (formation of a melamine-formaldehyde preliminary condensation product).

(4) A stirring speed in emulsification was controlled to 1500 rpm, and the melamine-formaldehyde preliminary condensation product was added to the emulsion prepared in C.

(5) $H_3PO_4$ was used to control the pH to 6.0.

(6) Subsequently, curing was carried out at 70° C. for 60 minutes to form an internal phase-containing microcapsule.

(7) 46.2 g of a 25% urea aqueous solution was added, and curing was carried out for 60 minutes.

(8) The stirring speed was set to 500 rpm, and 10 g of 20% NaOH was added. Then, the solution was cooled down to room temperature.

(9) Further, stirring was continued overnight as it was at room temperature to obtain a microcapsule dispersion (A).

The microcapsules thus obtained had a grain diameter of 2 to 12 $\mu$, and a great part thereof fell in a range of 6 to 7 $\mu$. The solid percent was determined by means of an electronic moisture content meter manufactured by Shimazu Seisakusho to find that it was 25.2% by weight.

I-2 Preparation of cyan microcapsule

In the preparation of the magenta microcapsule described in I-1, 20 g of C-3 was added in place of the dye precursor M-1, and the photo initiator was changed to 0.85 g of 1,1'-di-n-heptyl-3,3,3',3'-tetramethylindodicarbocyanine triphenyl-n-butylborate, whereby a microcapsule dispersion (B) was obtained. The microcapsule (B) thus obtained had a grain diameter of 2 to 12 $\mu$, and the solid percent was 26.3%.

I-3 Preparation of yellow microcapsule

In the preparation of the magenta microcapsule described in I-1, 20 g of Y-1 was added in place of the dye precursor M-1, and the photo initiator was changed to 0.8 g of 3,3-dimethyl-1-heptylindo-3'-heptylthiacyanine triphenyl-n-butylborate, whereby a microcapsule dispersion (C) was obtained. The microcapsule (C) thus obtained had a grain diameter of 5 to 10 $\mu$, and a great part thereof fell in a range of 6 to 8 $\mu$. The solid percent was 27.5%.

II. Preparation and coating of light-sensitive liquid

The microcapsule dispersion obtained in I and a color-developer HRJ-4250 (manufactured by Schenectady Chemical Co.) described in JP-A-1-168484 and JP-A-2-95884 were mixed as shown below to prepare a light-sensitive liquid (I).

| | |
|---|---|
| Microcapsule dispersion (A) | 5.6 g |
| Microcapsule dispersion (B) | 4.9 g |
| Microcapsule dispersion (C) | 4.7 g |
| HRJ-4250 | 15.8 g |
| $H_2O$ | 9.0 g |

The light-sensitive liquid (I) thus prepared was applied on a transparent PET film by means of a Mayer bar of # 20. The coated amount thereof after drying was 10.2 $g/m^2$.

Next, an opaque adhesive film (word processor adhesive film White WT-325W, manufactured by Plus) was stuck was a protective film on the surface of the coated sample to form a sandwich structure of the PET film, whereby a sample (I) was prepared.

Test 1:

The sample (I) thus prepared was irradiated with a LED (Ga, Al, As) having a main emission of 660 nm and a LED (GaN) having a main emission of 525 nm to cure the magenta capsule and the cyan capsule and then subjected to pressure development by means of a pressure roller, whereby a pure yellow color was developed on the whole surface.

Then, the above sample (I) was packed in a black polyethylene bag and held under storage conditions of 20° C. and a relative humidity of 20% for 72 hours. This sample was irradiated under the same exposure conditions as with the LED described above and subjected to pressure development, but a pure yellow color was not developed and magenta and cyan were only slightly developed, so that a turbid yellow color was developed.

A 50% calcium chloride dihydrate aqueous solution was absorbed into 3 g of a high water-absorbing resin Aquapren P-815 (manufacture by Meisei Kagaku Kogyo KK), which was put in a bag made of a water-impermeable and vapor-permeable non-woven fabric Taipeck 1073B (trade name, manufactured by Du Pont) and an aluminum-deposited film Metaline Film ML-CPWH (trade name, manufactured by Tosero KK), whereby a humidity-controlling material (I) was prepared. This humidity-controlling material (I) maintained the inside of a glass sealed vessel at 60% RH at 25° C.

Test 2:

Next, the humidity-controlling material described above and the above sample (I) were packed together in a black polyethylene bag and similarly maintained under storage conditions of 20° C. and a relative humidity of 20% for 72 hours. This sample was irradiated under the same exposure conditions as with the LED described above and subjected to pressure development to find that turbidity was not observed at all and a pure yellow color was developed. The respective developed color densities in an untreated condition and after aging were measured via a red filter, a green filter and a blue filter. The results thereof are shown in Table 1. In Table 1, R shows the measured value obtained via the red filter; G shows the measured value obtained via the green filter; and B shows the measured value obtained via the blue filter.

TABLE 1

| Test No. | Untreated condition | | | Aging for 72 hours | | | Humidity-controlling material |
|---|---|---|---|---|---|---|---|
| | R | G | B | R | G | B | |
| 1 (Comparison) | 0.20 | 0.21 | 1.50 | 0.55 | 0.47 | 1.50 | None |
| 2 (Invention) | 0.20 | 0.21 | 1.50 | 0.20 | 0.20 | 1.50 | Present |

It was found from the results shown in Table 1 that while the present invention using the humidity-controlling material (I) did not change at all in the density values, even after being maintained at a low humidity, and showed an excellent stability, the density values obtained via the red filter and the green filter increased when the humidity-controlling material was not used, so that a turbid yellow color was developed. The above comparative sample was observed under a microscope to find lump-shaped developed color matters of magenta and cyan in a developed yellow matter.

Example 2

In Example 1, a full color original image was introduced into a personal computer to expose the sample (I) by means of a red LED having a main emission in 660 nm, a green LED having a main emission in 525 nm and a blue LED (GaN) having a main emission in 470 nm, whereby a full color original image was reproduced. As a result thereof, the full color image close to the original image was obtained. Next, the sample (I) was stored in a black polyethylene bag in the same manner as in Example 1 and held under storage conditions of 20° C. and a relative humidity of 20% for 72 hours to investigate the change in the developed colors with the passage of time. Further, the humidity-controlling material was packed in the black polyethylene bag together with the sample (I), and they were held similarly under storage conditions of 20° C. and a relative humidity of 20% by 72 hours.

As a result thereof, while the sample allowed to coexist with the humidity-controlling material of the present invention was not different at all from what it was before storing for aging and showed a good full color reproducibility, the colors apparently darkened in the comparative example using no humidity-controlling material, so that the vivid full colors developed before storing for aging could not be reproduced.

Further, the samples described above were let to stand under the same conditions for 2 weeks, and the sample of the present invention gave a developed color image which was not different from what it was before storing for aging. In the comparative example using no humidity-controlling material, however, a muddy color was accelerated, and the fog density increased, so that an image which was darkened on the whole surface and had completely no commercial value was obtained.

Example 3

Test 3:
The sample (I) was stored in a black polyethylene bag together with the humidity-controlling material described above and maintained under storage conditions of 20° C. and a relative humidity of 80% for 2 weeks. It was exposed and developed in the same manners as in Example 2 to obtain a good full color image close to the original image. The fog densities in an untreated condition and after aging were measured in the same manner as in Example 1. The results thereof are shown in Table 2.

Test 4:
The samples were maintained in the same manner as described above, except that the humidity-controlling material was not used, and the resulting image did not reproduce the original full color image in terms of colors. The fog densities in an untreated condition and after aging were measured in the same manners as in Example 1. The results thereof are shown in Table 2.

TABLE 2

| Test No. | Untreated condition | | | Aging for 72 hours | | | Humidity-controlling material |
|---|---|---|---|---|---|---|---|
| | R | G | B | R | G | B | |
| 3 (Invention) | 0.24 | 0.20 | 0.22 | 0.27 | 0.21 | 0.23 | Present |
| 4 (Comparison) | 0.24 | 0.20 | 0.22 | 0.58 | 0.90 | 0.77 | None |

It was found from the results shown in Table 2 that while the present invention using the humidity-controlling material had a smaller increase in fog and showed an excellent stability, a marked increase in fog was shown when no humidity-controlling material was used.

Example 4

Test 5:
In Example 1 described previously, a humidity-controlling material (II) obtained by absorbing about 500 ml/m$^2$ of water into an absorbing sheet contained in a sanitary product (trade name: Elis) manufactured by Daio Seishi KK was used in place of the humidity-controlling material prepared from Aquapren P-815 and the 50% calcium chloride aqueous solution, and the sample (I) described in Example 1 was stored in a black polyethylene bag together with it and held under storage conditions of 20° C. and a relative humidity of 20% for 72 hours.

The sample was irradiated under the same exposure conditions as with the LED described previously and subjected to pressure development to find that turbidity was not observed at all and a pure yellow color was developed. The respective developed color densities in an untreated condition and after aging were measured via a red filter, a green filter and a blue filter. The results thereof are shown in Table 3. In Table 3, R shows the measured value obtained via the red filter; G shows the measured value obtained via the green filter; and B shows the measured value obtained via the blue filter.

TABLE 3

| Test No. | Untreated condition | | | Aging for 72 hours | | | Humidity-controlling material |
|---|---|---|---|---|---|---|---|
| | R | G | B | R | G | B | |
| 1 (Comparison) | 0.20 | 0.21 | 1.50 | 0.55 | 0.47 | 1.50 | None |
| 5 (Invention) | 0.20 | 0.21 | 1.50 | 0.20 | 0.20 | 1.50 | Present |

It was found from the results shown in Table 3 that the present invention using the absorbing sheet did not change at all in the density values, even after being maintained at a low humidity and showed an excellent stability.

Example 5

Test 6:

Example 2 was repeated except that the humidity-controlling material (II) described in Example 4 was used to form a full color image.

The humidity-controlling material (II) and the sample (I) were stored together in a black polyethylene bag similarly to Example 2 and maintained under storage conditions of 20° C. and a relative humidity of 20% for 72 hours. As a result thereof, the sample allowed to coexist with the humidity-controlling material (II) prepared according to the present invention was not different at all from what it was before being stored for aging and showed a good full color reproducibility.

Further, the sample was let to stand under the same conditions for 2 weeks, and a developed color image which was not different at all from what it was before aging was obtained.

Example 6

Test 7:

The sample (I) was stored in a bag using an aluminum-deposited polyethylene film (trade name: Metaline Film, manufactured by Toserlo KK) together with the humidity-controlling material (II) described above and maintained under storage conditions of 20° C. and a relative humidity of 20% for 4 weeks. It was exposed and developed in the same manner as in Example 2 to obtain a good full color image close to the original image. The sample was maintained in the same manner as described above, except that a black-colored Japanese paper was used in place of the aluminum-deposited polyethylene film to find that the resulting image apparently had a darkened color and the original full color image was not reproduced.

We claim:

1. A method of storing a dry image-forming material comprising a support and a layer provided thereon comprising a microcapsule containing at least a photo-curable compound, a photo initiator and a color precursor in an internal phase, and further comprising a color-developer in either the layer containing the microcapsules or a layer adjacent thereto, said method comprising a step of storing the dry image-forming material together with a humidity-controlling material.

2. The method as set forth in claim 1, comprising a step of storing the dry image-forming material and the humidity-controlling material with a low moisture-permeable film.

3. The method as set forth in claim 1, wherein the humidity-controlling material comprises a water-absorbing substance containing a salt solution or water and having at least part of a wall thereof composed of cloth, film or paper.

4. The method as set forth in claim 3, wherein the humidity-controlling material is a vessel or a bag of which at least part of the wall is composed of a water-impermeable and vapor-permeable film or non-woven fabric.

5. The method as set forth in claim 3, wherein the water-absorbing substance is a high water-absorbing resin.

6. The method as set forth in claim 5, wherein the high water-absorbing resin is a vinyl alcohol-acrylamide copolymer or a modified polyethylene oxide.

7. The method as set forth in claim 5, wherein the high water-absorbing resin is a metal salt of polyacrylic acid, a cellulose-based polymer or a starch-based polymer.

8. The method as set forth in claim 4, wherein the water-absorbing substance is cotton, pulp, sponge, cloth or non-woven fabric.

9. The method as set forth in claim 2, wherein the low moisture-permeable film is a plastic film on which is deposited a metal.

10. The method as set forth in claim 9, wherein the metal is aluminum.

11. The method as set forth in claim 1, wherein the photo-curable compound is a radical addition-polymerization product.

12. The method as set forth in claim 1, wherein the photo initiator generates free radicals and is capable of absorbing radiation to initiate free radical polymerization of a polymerizable or cross-linkable compound.

13. The method as set forth in claim 1, wherein the color precursor is a substantially colorless, electron-donating compound containing a lactone, lactam, sultone, spiropyran, ester or amide in a partial skeleton thereof.

14. The method as set forth in claim 1, wherein the color-developer is a clay, a phenol resin, a metal salt of salicylic acid or a mixture thereof.

15. An image-forming kit comprising a dry image-forming material and a humidity-controlling material, said dry image-forming material comprising a support, a layer provided thereon comprising a microcapsule containing at least a photo-curable compound, a photo-initiator and a color precursor in an internal phase, and a color developer in either the layer comprising the microcapsule or a layer adjacent thereto.

16. The kit of claim 15, wherein said humidity-controlling material comprises a low moisture-permeable film.

17. The kit of claim 15, wherein said humidity-controlling material comprises a water-absorbing substance containing a salt solution or water.

18. The kit of claim 15, wherein said humidity-controlling material comprises a high water-absorbing resin.

19. The kit of claim 18, wherein the high water-absorbing resin is a metal salt of polyacrylic acid, a cellulose-based polymer or a starch-based polymer.

* * * * *